(12) United States Patent
Harary et al.

(10) Patent No.: US 9,910,076 B2
(45) Date of Patent: Mar. 6, 2018

(54) METHOD AND SYSTEM FOR ANALYSIS OF ENERGY SAVINGS IN AN ELECTRICAL NETWORK

(71) Applicant: Elspec Engineering Ltd., Caesarea (IL)

(72) Inventors: Yoram Harary, Tel Mond (IL); Oren Harary, Tel Mond (IL)

(73) Assignee: Elspec Engineering Ltd., Caesarea (IL)

(*) Notice: Subject to any disclaimer, the term of this patent is extended or adjusted under 35 U.S.C. 154(b) by 551 days.

(21) Appl. No.: 14/542,663

(22) Filed: Nov. 17, 2014

(65) Prior Publication Data
US 2016/0139188 A1 May 19, 2016

(51) Int. Cl.
| | | |
|---|---|---|
| G01R 21/133 | (2006.01) | |
| G01R 21/00 | (2006.01) | |
| H02J 3/18 | (2006.01) | |
| H02J 3/00 | (2006.01) | |

(52) U.S. Cl.
CPC ......... *G01R 21/133* (2013.01); *G01R 21/002* (2013.01); *H02J 3/00* (2013.01); *H02J 3/18* (2013.01)

(58) Field of Classification Search
CPC .... G01R 19/2513; G01R 22/10; G01R 29/18; G01R 21/133; G01R 21/1331; G01R 27/02; G01R 19/175
See application file for complete search history.

(56) References Cited

U.S. PATENT DOCUMENTS

| 8,447,541 B2 * | 5/2013 | Rada ........................ G05F 1/70 62/130 |
| 2002/0007388 A1 | 1/2002 | Bannai et al. |
| 2010/0026096 A1 * | 2/2010 | Yeh .......................... H02J 3/14 307/39 |
| 2011/0148202 A1 * | 6/2011 | Rada ........................ G05F 1/70 307/52 |
| 2011/0153246 A1 | 6/2011 | Donaldson et al. |
| 2012/0063039 A1 | 3/2012 | Shah et al. |

(Continued)

FOREIGN PATENT DOCUMENTS

KR  101375925  4/2014

OTHER PUBLICATIONS

International Search Report for PCT Application No. PCT/IL2015/051103 dated Feb. 25, 2016.

*Primary Examiner* — Jaehwan Oh
(74) *Attorney, Agent, or Firm* — Pearl Cohen Zedek Latzer Baratz LLP

(57) ABSTRACT

A method for analysis of energy savings in an electrical network includes obtaining measurements of a plurality of measurement devices linked to loads of the electrical network over a first period of time. A unified signature that characterizes the recorded measurements during the first period of time is calculated. Measurements of the plurality of measurement devices in the electrical network are obtained over a second period of time after introduction of a modification into the electrical network. A unified signature that characterizes the recorded measurements during the second period of time is calculated. The unified signature that characterizes the measurements during the second period of time is compared with the unified signature that characterizes the measurements during the first period of time to calculate energy savings resulting from introduction of the modification.

12 Claims, 9 Drawing Sheets

(56) References Cited

U.S. PATENT DOCUMENTS

2012/0265586 A1 10/2012 Mammone
2013/0030579 A1 1/2013 Milosevie
2016/0118878 A1* 4/2016 Alteneiji ............... H02J 3/1821
323/205

* cited by examiner

METHOD AND SYSTEM FOR ANALYSIS OF ENERGY SAVINGS IN AN ELECTRICAL NETWORK

FIELD OF THE INVENTION

The present relates to power measurements. More particularly, the present innovation relates to a method and system for analysis of energy savings in an electrical network.

BACKGROUND OF THE INVENTION

Devices that operate on an electrical network, e.g., of a manufacturing plant or other installation, consume active and reactive power. The active power is converted into work or heat and may be measured in units of power, such as kilowatts (kW). The reactive power results from a phase shift between the voltage and current, and may be expressed in units of reactive power, such as volt-amperes reactive (var) or kilovolt-amperes reactive (kvar).

Consumption of reactive power is a characteristic of electric devices that utilize the inductive properties of an alternating electromagnetic field, such as motors or transformers. The total electrical power that is consumed by a device may be represented by a vector sum or difference of the reactive and active power components. The magnitude of this vector sum is referred to as apparent power.

This phenomenon of reactive power may have consequences for electrical networks of both low and high voltage. Devices that store energy by virtue of a magnetic field produced by a flow of current are said to absorb reactive power. Those devices that store energy by virtue of electric fields are said to generate reactive power. Power flows, both active and reactive, must be carefully controlled in order for a power system to operate within acceptable voltage limits. Reactive power flows can give rise to substantial voltage changes across the system. Thus, it is necessary to maintain reactive power balances. Reactive power compensation is an essential feature in a power system's operation and maintenance of acceptable voltage levels during contingencies in power systems. One or more techniques may be applied to compensate for the reactive power of a load that is connected to a power system.

Power electronic devices such as power converters, power supplies, converter-fed motors, and, in some cases, the power compensation circuit itself, such as a static var compensator (SVC), may cause harmonic pollution. Harmonic pollution causes a strong distortion of the fundamental sinusoidal wave shape of voltage and current. Fourier analysis of a fundamental period reveals the presence of typical harmonic frequencies that may be multiples of the fundamental frequency (e.g., 50 Hz or 60 Hz). Harmonic pollution may be caused by power converters and other power electronics that may generate, e.g., in a 50 Hz system, such harmonics as 250 Hz, 350 Hz, 550 Hz, 650 Hz, or higher frequency harmonics.

Energy losses in electrical network elements, such as lines, transformers, or loads, may result from current and harmonic losses. Current losses may include resistive heating in conductive elements. Harmonic losses may include skin effect, hysteresis, and negative sequence losses. The skin effect refers to the tendency of an alternating electric current (AC) to become distributed within a conductor such that the current density is largest near the surface of the conductor, and decreases with depth within the interior of the conductor. As a result, the effective cross section of the conductor is reduced and resistive increase. Hysteresis losses may include heat loss that is associated with magnetic hysteresis properties of an AC motor armature or transformer. Negative sequence losses refer to a magnetic field that rotates against the main field in a motor due to fifth, eleventh, or other harmonics, generating heat and reducing efficiency.

Loads may not be stable and may change over time. Some loads may change rapidly, such as those due to molding machines in a plastics plant. Each molding machine has its own cycle of operation and several machines that are fed by a single transformer may operate independently from one another. As a result, power consumption may not be controlled and may change rapidly.

In addition, harmonics in voltage and current may have a substantial effect on power consumption and losses.

For some devices, there are no measurement methods that can directly measure or estimate losses. For example, these devices may include a large number of elements that may be affected by a harmonics spectrum which may change rapidly. The exact relation between harmonics and losses may be unknown, affected by materials, specifics of mechanical structure, and a nonlinear relationship between the harmonics and the losses. Furthermore, a mode of operation of each device may be variable, depending on a particular production process that is in progress.

SUMMARY OF THE INVENTION

There is thus provided, in accordance with an embodiment of the present invention, a method for analysis of energy savings in an electrical network, the method including: obtaining measurements of a plurality of measurement devices linked to loads of the electrical network over a first period of time; calculating a unified signature that characterizes the recorded measurements during the first period of time; obtaining measurements of the plurality of measurement devices in the electrical network over a second period of time after introduction of a modification into the electrical network; calculating a unified signature that characterizes the recorded measurements during the second period of time; and comparing the unified signature that characterizes the measurements during the second period of time with the unified signature that characterizes the measurements during the first period of time to calculate energy savings resulting from introduction of the modification.

Furthermore, in accordance with an embodiment of the present invention, the measurements include a measurement of active power consumption or of a load resistance.

Furthermore, in accordance with an embodiment of the present invention, the unified signature includes a relationship between active power consumption by the network and a concurrent equivalent resistance of the network.

Furthermore, in accordance with an embodiment of the present invention, the equivalent resistance is equal to an inverse of a sum of inverses of transformed resistance values of a plurality of loads that are connected to the network, each transformed resistance value including a product of a measured resistance of a load of the plurality of loads and a square of a primary/secondary ratio of a transformer that connects that load to the network.

Furthermore, in accordance with an embodiment of the present invention, the measured resistances of the plurality of loads are measured concurrently.

Furthermore, in accordance with an embodiment of the present invention, comparing the unified signatures includes calculating a representative power difference between the unified signatures.

Furthermore, in accordance with an embodiment of the present invention, calculating the representative power difference includes calculating a weighted average of a plurality of power differences in different ranges of the equivalent resistance, each of the plurality of power differences being weighted by a number of measurements that yielded an equivalent resistance value within the corresponding range of the equivalent resistance.

Furthermore, in accordance with an embodiment of the present invention, the introduced modification includes introduction of a tuned or detuned reactive power compensator.

Furthermore, in accordance with an embodiment of the present invention, the introduced modification includes adjusting a voltage.

Furthermore, in accordance with an embodiment of the present invention, comparing the unified signatures includes fitting a curve to at least one of the unified signatures.

Furthermore, in accordance with an embodiment of the present invention, a length of the first period or the second period is selected to correspond to a periodicity in the operation of the electrical network.

There is further provided, in accordance with an embodiment of the present invention, a system for analysis of energy savings in an electrical network, the system including: a plurality of measurement devices that are connected to the network; and a processor configured to obtain measured values from the plurality of measurement devices during a first period of time; calculate a unified signature that characterizes the measured values that were measured during the first period of time; obtain measured values from the plurality of measurement devices during a second period of time after introduction of a modification into the electrical network; calculate a unified signature that characterizes the measured values that were measured during the second period of time; and compare the unified signature that characterizes the measurements during the second period of time with the unified signature that characterizes the measurements during the first period of time to calculate energy savings resulting from introduction of the modification.

Furthermore, in accordance with an embodiment of the present invention, the plurality of measurement devices includes a measurement device configured to measure active power consumption at a common supply point of the network.

Furthermore, in accordance with an embodiment of the present invention, the plurality of measurement devices includes a measurement device configured to measure a resistance of a load that is connected to a common supply point of the network via a transformer.

Furthermore, in accordance with an embodiment of the present invention, the system further includes a data storage device, wherein the processor is configured to store measurement results on the data storage device.

Furthermore, in accordance with an embodiment of the present invention, the introduced modification includes an energy saving device that is connected to the network.

Furthermore, in accordance with an embodiment of the present invention, the energy saving device includes a tuned or detuned reactive power compensator.

Furthermore, in accordance with an embodiment of the present invention, the introduced modification includes a change in a voltage that is provided to a load of the network.

Furthermore, in accordance with an embodiment of the present invention, the change in voltage results from employing voltage tapping.

There is further provided, in accordance with an embodiment of the present invention, a method for analysis of energy savings in an electrical network, the method including: obtaining measurements of a plurality of measurement devices linked to loads of the electrical network over a first period of time; calculating a unified signature that characterizes the recorded measurements during the first period of time; simulating predicted measurements of the plurality of measurement devices in the electrical network over a second period of time after introduction of a modification into the electrical network; calculating a unified signature that characterizes the simulated measurements during the second period of time; and comparing the unified signature that characterizes the measurements during the second period of time with the unified signature that characterizes the measurements during the first period of time to calculate energy savings resulting from introduction of the modification.

BRIEF DESCRIPTION OF THE DRAWINGS

In order for the present invention, to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
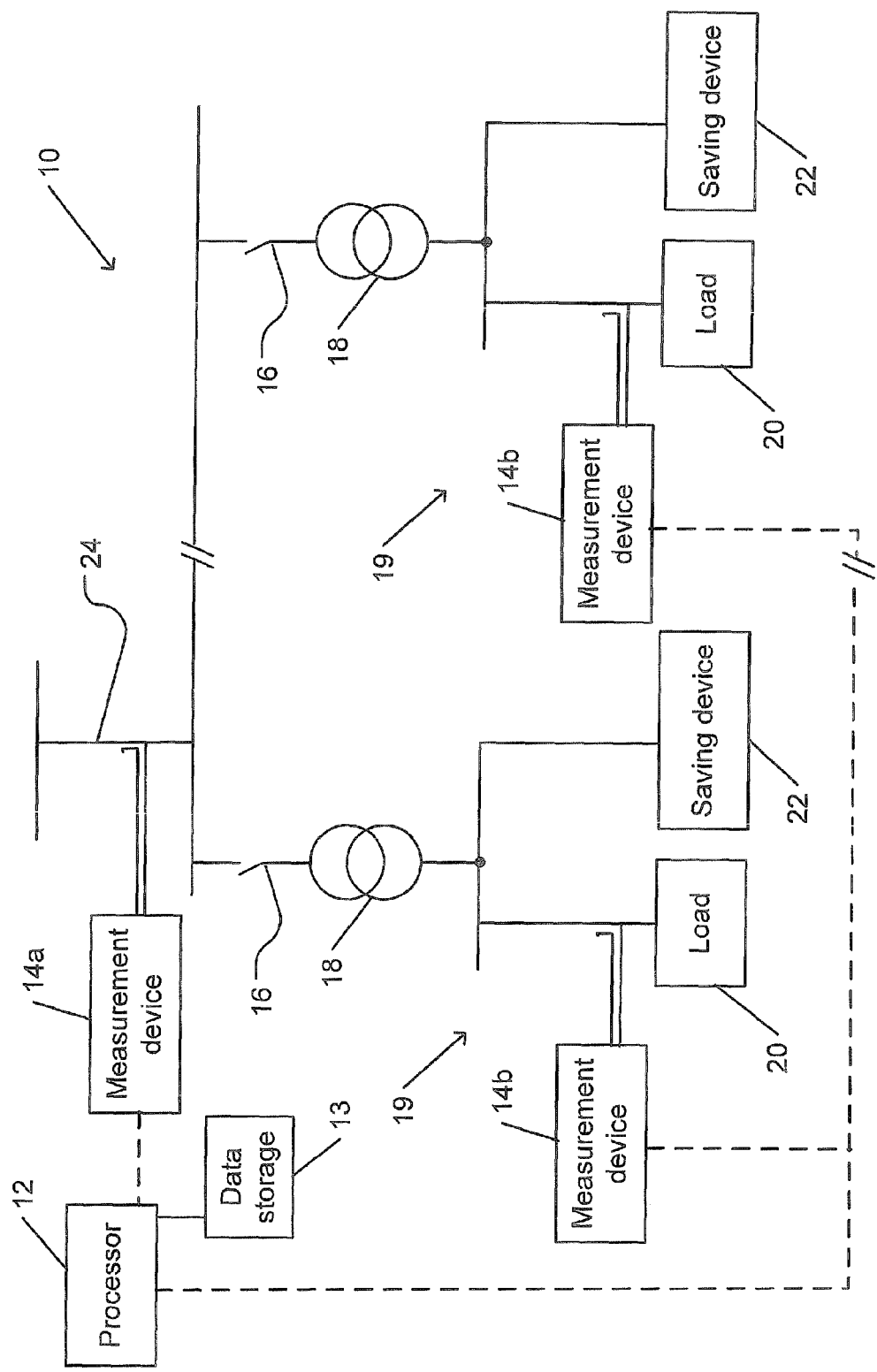
FIG. 1 schematically illustrates an electrical network to which may be applied energy savings analysis, in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, us of the conjunction "or" as used herein is to be understood as inclusive (any or all of the stated options).

In accordance with an embodiment of the present invention, analysis of energy savings in an electrical network is based on signature analysis of power consumption, which may be affected by supply conditions. The supply conditions may be changed by modifying the electrical network. For example, energy-saving devices or voltage tapping may be introduced into the electrical network. As a result of the modification, the consumption signature of the electrical network may change. The change in the signature may enable measurement or calculation of any savings or losses in electrical power consumption.

Energy losses in an electric network may be reduced by implementation of current reduction devices and harmonics reduction devices. Current reduction devices may include a combination of passive elements, such as shunt capacitors or inductors. Current reduction devices may include electro-mechanically switched, tuned, or detuned capacitor banks to cope with load changes, which may be electronically switched to provide rapid and accurate reactive power control. Current reduction devices may include a static var compensator based on thyristor control reactors (TCR), thyristor switched capacitors (TSC), or fixed capacitors tuned to filters. In some applications, a static var compensator (SVC) may be simplified to include only a plurality of TSC-based branches.

Harmonic reduction devices may include detuned filters with reactors that are installed in series with capacitors and that prevent resonance conditions by shifting the resonance frequency between the capacitor and the network below the first dominant harmonic (e.g., the fifth). If harmonic filtration is needed in addition to resonance prevention, tuned reactors may be utilized. The capacitor/reactor filter may be tuned to absorb and reduce the total harmonic distortion (THD).

Power consumption is a function of the voltage. In a linear load the power consumption depends on the square of the voltage ($V^2$). However, in a non-linear load, the power consumption may have a different dependence. The voltage may be reduced or increased by control of a tap changer of a transformer, in a process that is referred to herein as "voltage tapping".

An electrical network may be divided into unchanged elements, such as transformers and a power supply line, and a variable load, such as machinery, air conditioning, ventilation, or illumination. Supply conditions to the variable load can be modified by using saving devices, voltage tapping, or by applying other techniques.

Energy saving may be a relatively small percentage of the total consumption. Power consumption is usually not a fixed value and changes in time due to load variation. In most cases loads which are affected by production process cannot be controlled and must run continuously, depending on varying production demands. In addition, production might be interrupted by failures or maintenance operation.

In accordance with an embodiment of the present invention, measurement devices or sensors are installed at various locations or points of the electrical network. The measurement devices may be couple to the network by a physical, magnetic, capacitive, or other coupling. Operation of the electrical network is monitored by the measurement devices. The measurement devices are configured to periodically measure one or more parameters or quantities related to operation of the electrical network. For example, one or more controllers may control operation of the measurement devices. The measured quantities may include voltages, currents, powers, or one or more other directly measured or derived quantities, such as waveforms, load resistance or impedance, harmonics, frequencies, phases, or other quantities. The measurements that are made by the various measurement devices are concurrent with one another, or otherwise synchronized with one another. The results of the measurements are recorded for later analysis.

The monitoring of the electrical network may continue throughout a predetermined period. The predetermined period may be selected to correspond to a periodicity in the operation of the electrical network and to cover a full range of loads from low to high. The predetermined period may be a day, a plurality of days, a week, a plurality of weeks, a month, a plurality of months, or another shorter or longer period of time. For example, over the course of a week, in some cases, the electrical network, or a plant whose electrical power is supplied by the electrical network, may, during the course of a week, include periods of peak operation (e.g., midweek daytime hours) and periods of minimal operation (e.g., weekends or nighttime hours). Monitoring of the electrical network may be avoided during exceptional periods of time, such as holiday or vacation seasons, planned shutdowns, unusual periods of peak operation (e.g., prior to a deadline), or other exceptional periods of time. Alternatively, a period of time over which the measurements are made may include one or more such exceptional periods of time, together with periods of typical operation.

The measurements made during the course of the period of time by each measurement device may be summarized in the form of a signature relationship. The signature relationship may be presented graphically in the form of a signature curve of active power versus the resistance of the load to which the measurement device is connected.

It should be noted that the power consumption and load are typically measured at different points of the electrical network. The power consumption may be measured at a connection point, while the loads may be measured at transformer output points. In case of more than one transformer, the measured loads may be normalized by a factor that depends on the voltage ratio of the corresponding transformer.

The individual signature relationships may be combined to form a unified signature relationship that is representative of the electrical network as a whole. Concurrently acquired individual signature relationships may combined by transforming the active resistance to an equivalent resistance. The unified signature relationship may be presented graphically in the form of a unified signature curve, in which active power is plotted versus the equivalent resistance.

Signature relationships may be measured at different times under different supply conditions.

Analysis of the electrical system may suggest one or more modifications that may result in energy savings. One or more of the suggested modifications may be implemented in the electrical network. The measurements may then be repeated. Analysis of the measurements may result in a modified unified signature relationship or curve. The modified unified signature relationship may be compared with the original unified signature relationship that resulted from analysis of the original measurements. Comparison the modified unified signature relationship with the original unified signature relationship may directly and unambiguously demonstrate energy savings or losses due to a modification of the electrical network. A difference between two signature relationships may not be uniform for the entire range of equivalent resistance. In such a case, a comparison may include calculation of an average or other representative value of the signature relationship. For example, an average value may be calculated by weighting each measurement result by a probability or frequency of occurrence of a particular resistance value.

Analysis by comparing signature relationships may be advantageous over comparison between total power before and after the modification. Since loads may be variable, comparison of total power consumption may not be indicative of changes due to modification of the electrical network. However, a difference between signatures may be indicative of a trend of power consumption.

Deviations in a relatively small number of measurements may occur to such a network due to interruptions as sagging or swelling. Filtering may be applied to eliminate some such deviations.

The method of signature analysis can be carried out continuously without losing any information over a long period of examination.

FIG. 1 schematically illustrates an electrical network to which may be applied energy savings analysis, in accordance with an embodiment of the present invention.

Electrical network 10 includes one or more loads 20. For example, a secondary circuit 19 that includes each of loads 20 may be coupled to common supply point 24 via a switch 16 and transformer 18. Each of transformers 18 may be characterized by different transformer ratios. Thus, each or some of loads 20 may operate at different voltages.

Processor 12 is in communication with one or more measurement devices 14a and 14b. The communication between processor 12 and a measurement device 14a or 14b may be via a wired or wireless connection. For example, processor 12 may include one or more processing units, e.g. of one or more computers. Processor 12 may be configured to operate in accordance with programmed instructions stored on data storage device 13.

Processor 12 may communicate with data storage device 13. Data storage device 13 may include one or more fixed or removable nonvolatile data storage devices. For example, data storage device 13 may include a computer readable medium for storing program instructions for operation of processor 12. It is noted that data storage device 13 may be remote from processor 12. In such cases data storage device 13 may be a storage device of a remote server storing an installation package or packages that can be downloaded and installed for execution by processor 12. Data storage device 13 may be utilized to store data or parameters for use by processor 12 during operation, or results of operation of processor 12.

Measurement devices 14a and 14b may each represent a plurality of measurement devices or sensors that are each configured to measure a different parameter or quantity of a component of electrical network 10.

Measurement device 14a is connected to common supply point 24. Measurement device 14a may be configured to measures total power consumption of electrical network 10. Measurement devices 14b are connected to the secondary circuits 19 that are each connected to common supply point 24 via a corresponding transformer 18. Each measurement device 14b is configured to measure power consumption of the load 20 of the secondary circuit 19 to which that measurement device 14b is connected. Measurement devices 14a and 14b are capable of measuring electric parameters, such as power consumption and load resistance, continuously or periodically. Measurements may be synchronized with one another. Fore example, a time of each measurement may be extracted from the Global Positioning System (GPS), from an Internet Simple Network Time Protocol (SNTP) server, or otherwise.

The acquired measurements may be analyzed by processor 12. For example, processor 12 may generate a signature relationship for each load 20. The signature relationship may be expressed graphically in the form of a signature curve.

Figure 2:
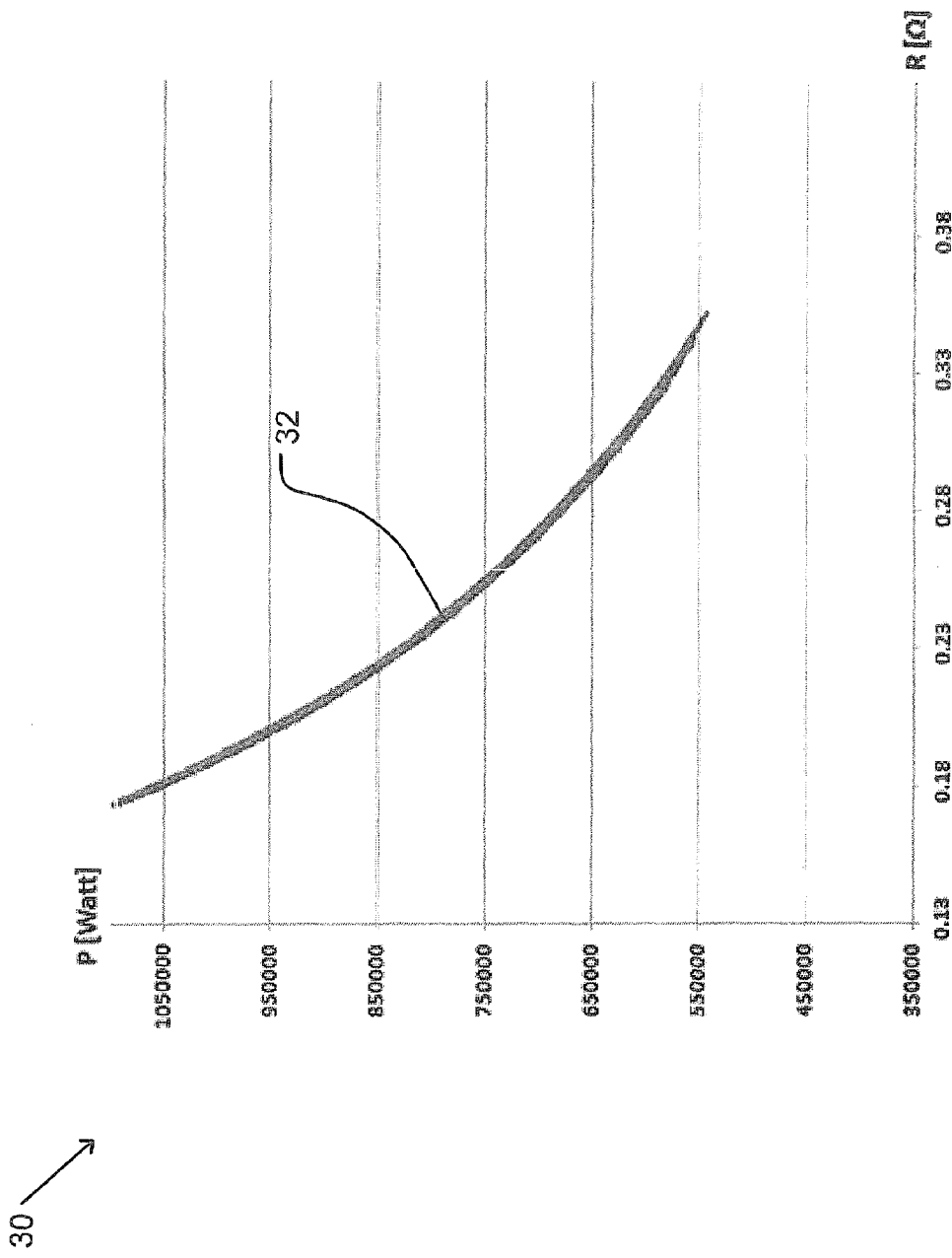
FIG. 2 shows an example of a signature curve for a load, in accordance with an embodiment of the present invention.

FIG. 2 shows an example of a signature curve for a load, in accordance with an embodiment of the present invention.

Graph 30 includes signature curve 32. Signature curve 32 is a plot of power consumption P (e.g., in units of watts) at common supply point 24 versus the resistance R of the load 20 (e.g., in units of ohms) at each time of measurement. For example, the power consumption at common supply point 24 may be measured by measurement device 14a when the switch 16 to that load 20 is closed, while the other switches 16 are open. Alternatively or in addition, power consumption by a load 20 may be measured by the corresponding measurement device 14b. The resistance R of a load 20 may be measured by the corresponding measurement device 14b, or may be calculated by processor from measurements by measurement device 14b.

Some deviations may occur during a period of measurement. For example, deviations may result from sag, swell, or other phenomena. In some cases, such deviations may not be of interest in analysis of electrical network 10. Thus, deviations may be excluded from consideration by filtering or use of thresholds.

A transformation may be applied to each signature relationship to create a unified signature relationship. This may be graphically represented by a transformation of each of several signature curves and combining the transformed curves to form a single unified signature curve.

Figure 3:
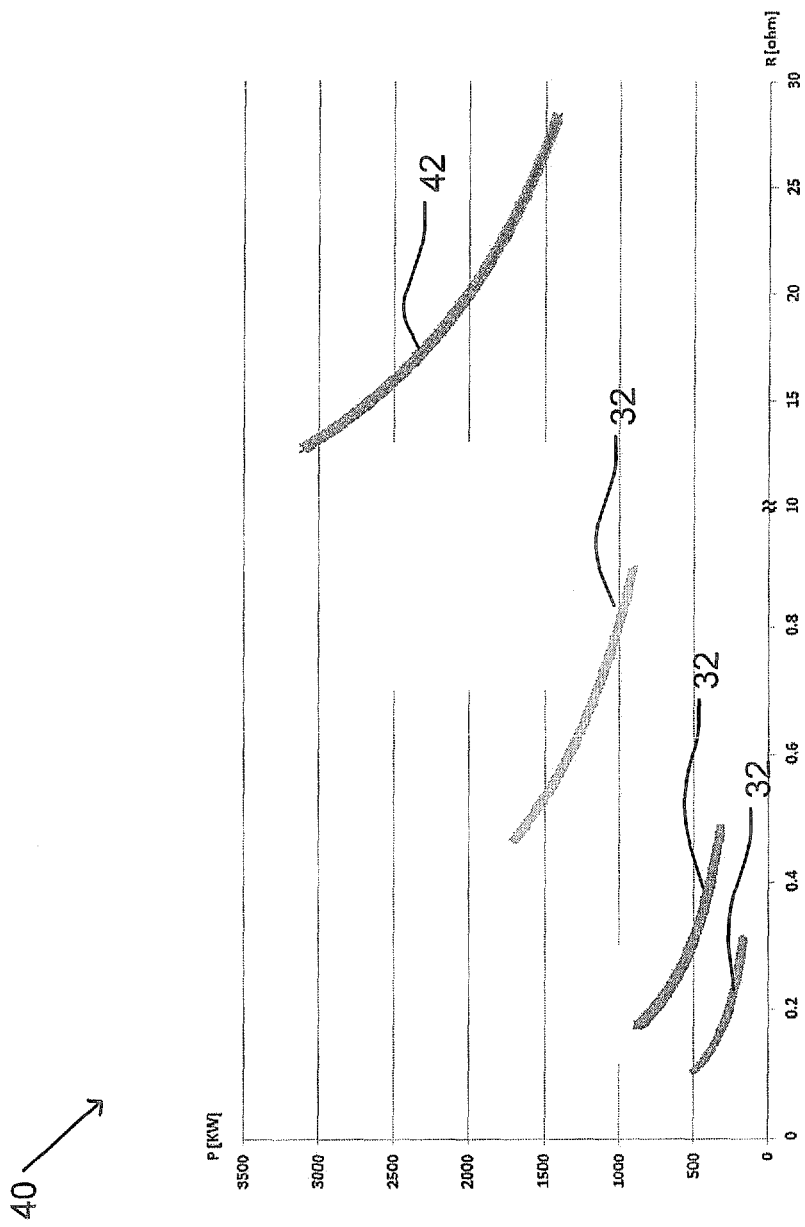
FIG. 3 schematically illustrates transformation and combination of individual signature curves to form a unified signature curve, in accordance with an embodiment of the present invention.

FIG. 3 schematically illustrates transformation and combination of individual signature curves to form a unified signature curve, in accordance with an embodiment of the present invention.

Graph 40 shows a plurality of signature curves 32. For example, each signature curve 32 may represent measurements made by a particular measurement device 14a or 14b. All of the measurements that are represented by signature curves 32 are made during the same time period and under the same supply conditions.

Signature curves 32 present a multi-dimensional solution space. Signature curves 32 may be unified into a single unified signature curve 42. Unified signature curve 42 may be analyzed to determine a trend of power consumption by electric network 10. Unified signature curve 42 is formed by performing a transformation on each of signature curves 32. The transformation includes a transformation of the measured resistance R of each of loads 20 to an equivalent resistance $R_{EQV}$.

Unified signature curve 42 presents the active power P measured by measurement device 14b versus the equivalent resistance $R_{EQV}$. The equivalent resistance may be expressed in units of ohms.

Unified signature curve 42 may be compared to another unified signature curve that is generated after modification of electrical network 10, e.g., by addition of an energy saving device 22, e.g., in the form of a compensator.

Figure 4:
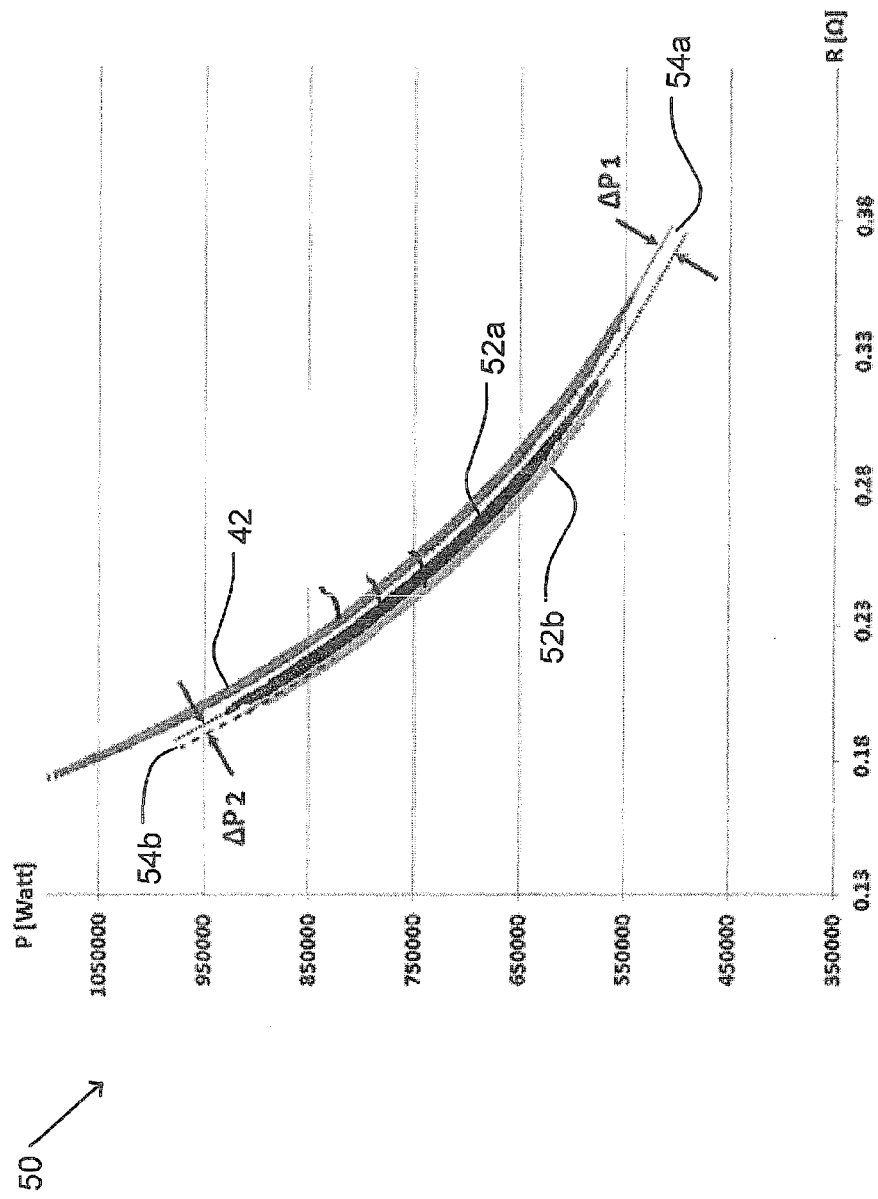
FIG. 4 schematically illustrates a comparison of unified signature curves of an electrical network before and after modification of the network.

FIG. 4 schematically illustrates a comparison of unified signature curves of an electrical network before and after modification of the network.

Graph 50 includes unified signature curve 42. Modified unified signature curves 52a and 52b represent measurements on electrical network 10 after different modifications.

For example, compensated unified signature curve 52a may represent measurements on electrical network 10 after addition of an energy saving device 22 in the form of a detuned type of a reactive power compensator. Power difference 54a, with a magnitude of $\Delta P_1$, represents the power reduction due to addition of the detuned type of reactive power compensator. Compensated unified signature curve 52b may represent measurements on electrical network 10 when an energy saving device 22 in the form of a tuned type of a reactive power compensator is added instead of the detuned type. Power difference 54b, with a magnitude of $\Delta P_2$, represents the additional power reduction due to replacement of the detuned type with the tuned type of reactive power compensator.

Power difference 54b may represent the additional power reduction due solely to reduction of harmonics in current and voltage. In this case, the power usage at the fundamental frequency may be identical for the two modifications represented by compensated unified signature curves 52a and 52b. Power difference 54b may then represent additional saving by reduction of harmonic losses due to higher harmonics that are present when a detuned type compensation system is used.

Figure 5:
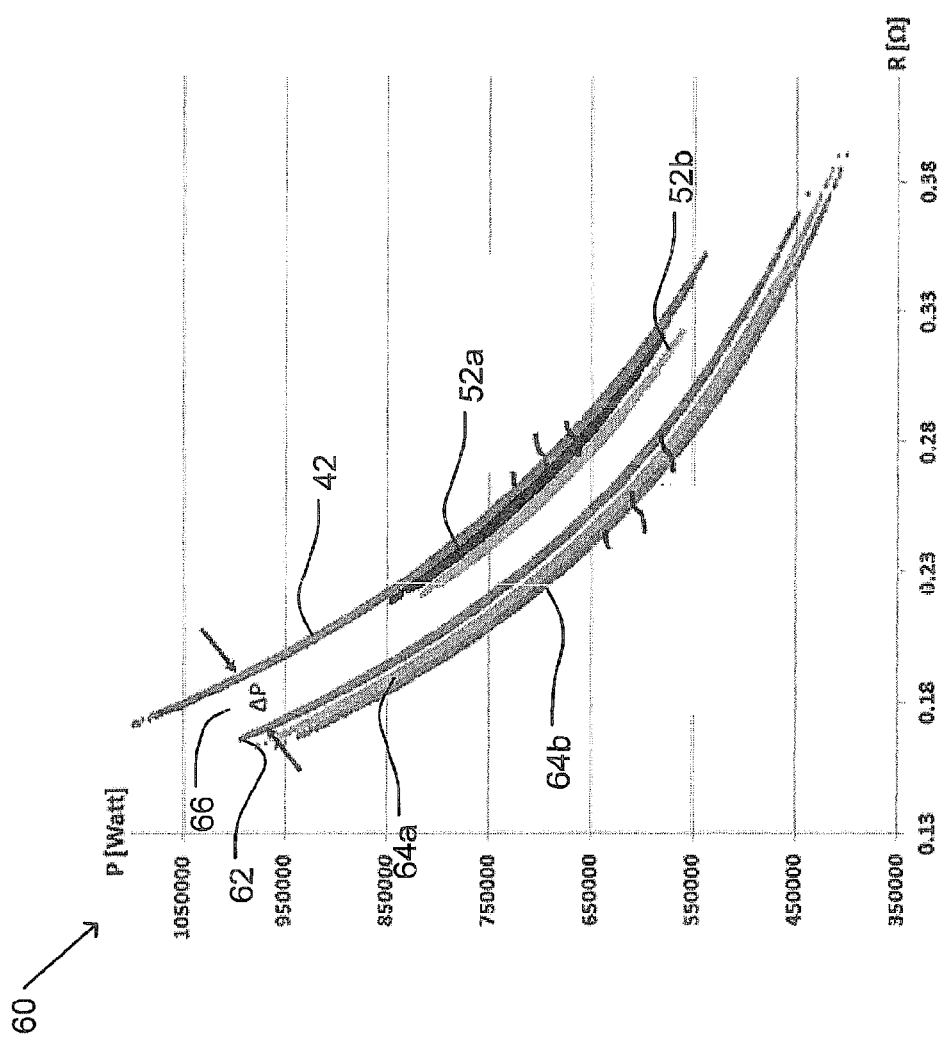
FIG. 5 schematically illustrates a comparison of unified signature curves before and after reduction in system voltage.

FIG. 5 schematically illustrates a comparison of unified signature curves before and after reduction in system voltage.

Graph 60 includes unified signature curve 42 and compensated unified signature curves 52a and 52b. After reduction of network voltage (e.g., by 5% or another value), measurements on the electrical network that was represented by unified signature curve 42 may indicate consumption of less electrical power, as indicated by reduced voltage unified signature curve 62. Power difference 66, with a magnitude of $\Delta P$, represents the reduction in power consumption due to the reduction in voltage. Similarly, measurements on the modified systems that correspond to compensated unified signature curves 52a (detuned compensation) and 52b (tuned compensation), may, as a result of the reduction in voltage, be measured to have reduced power consumption as indicated by reduced voltage compensated unified signature curves 64a and 64b, respectively. The power differences for reduced voltage compensated unified signature curves 64a and 64b, whose magnitudes are similar to $\Delta P$, are not shown in FIG. 5 for the sake of clarity.

Figure 6:
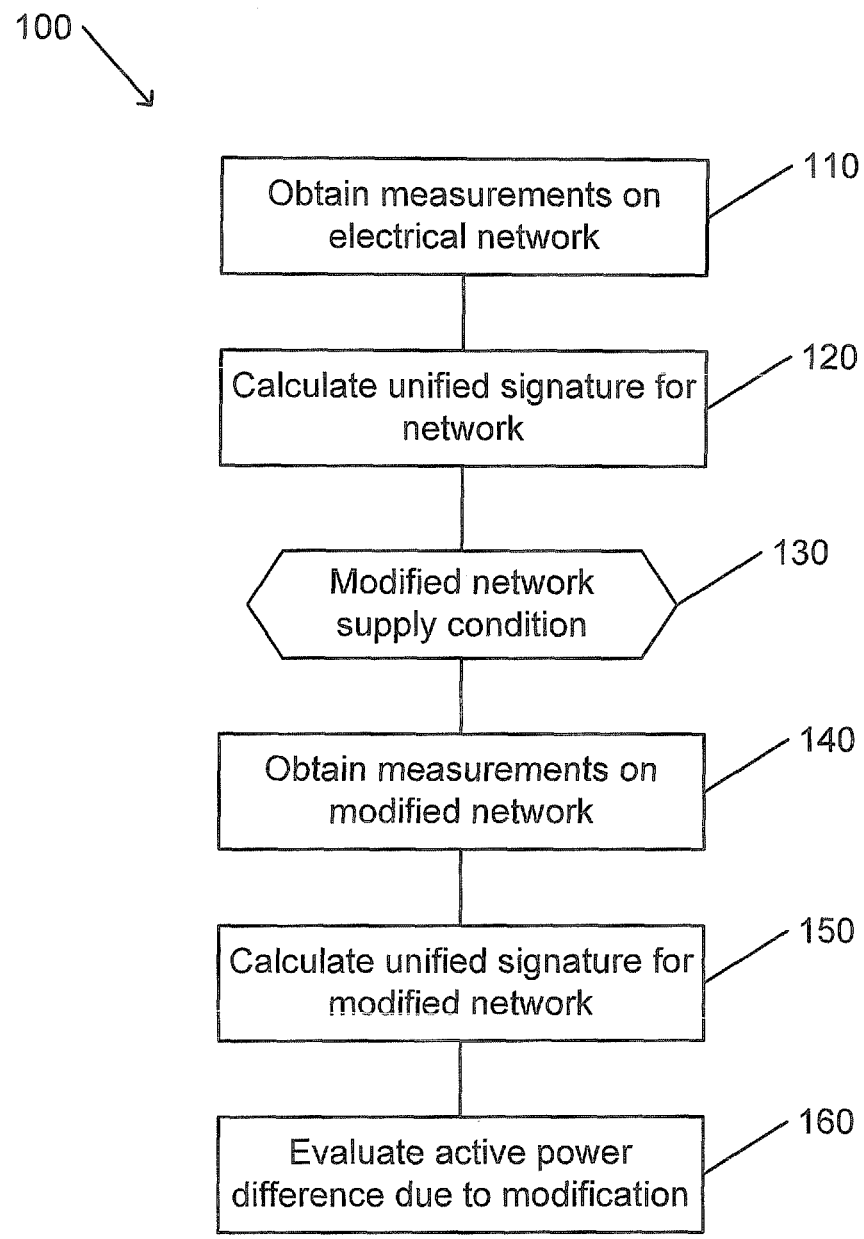
FIG. 6 is a flowchart depicting a method for evaluating energy savings in an electrical network, in accordance with an embodiment of the present invention.

FIG. 6 is a flowchart depicting a method for evaluating energy savings in an electrical network, in accordance with an embodiment of the present invention.

It should be understood with respect to any flowchart referenced herein that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Operations of energy savings evaluation method 100 may be executed by a processor. For example, the processor may be a processor that is configured to operate one or more measurement devices that are configured to measure one or more parameters or quantities that are related to operation of an electrical network, and to analyze the measurements.

Measurement devices may be operated to obtain a set of measurements of parameters or quantities that are related to operation of an electrical network (block 110).

For example, a measurement device (e.g., measurement device 14a) may be configured to measure the total active power at a network connection point (e.g., common supply point 24). One or more measurement devices (e.g., measurement devices 14b) may be configured to measure the resistance of one or more loads (e.g., loads 20) that are each connect to the remainder of the network via a transformer (e.g., transformers 18). Other parameters or quantities may be measured.

Measurements by the various measurement devices may be synchronized, e.g., by utilizing GPS or an SNTP server output. Measurements from the various measurement devices are acquired periodically throughout a measurement period, and the measurements are recorded and saved (e.g., together with a time of measurement on a data storage device).

Measurements may provide such information as maximum voltage, average voltage, and minimum voltage (during acceptable operation of the network).

A unified signature relationship may be calculated for the network using the obtained measurement results (block 120). For example, the unified signature relationship may relate total active power consumption by the network with a concurrent equivalent resistance $R_{EQV}$ based on resistance measurements that were made concurrently with the measurement of the total active power. For example, the equivalent resistance may be calculated at a given time during the measurements from n concurrently measured individual load resistances $R_i$:

$$\frac{1}{R_{EQV}} = \sum_{i=1}^{n} \frac{1}{R_{Ti}}$$

$R_{Ti}$ represents the transformed resistance value of a load i:

$$R_{Ti} = R_{Mi} N_i^2$$

where $R_{Mi}$ is the measured resistance value of load i, and $N_i$ is the primary/secondary ratio of a transformer that connects load i to the remainder of the network. Thus, $R_{EQV}$ may be described as equal to an inverse of a sum of inverses of transformed resistance values of a plurality of loads that are connected to the network. Each transformed resistance value is based (e.g., the calculation may include one or more constant factors) on a product of a measured resistance of a load of the plurality of loads and a square of a primary/ secondary ratio of a transformer that connects that load to the network.

A unified signature curve that represents the unified signature relationship may plot each measured value of the total active power consumption versus the value of $R_{EQV}$ that is based on the concurrently measured values of $R_i$ of the loads of the electrical network.

A supply condition of the electrical network may have been modified (block 130). For example, an energy-saving device, such as a compensator or other energy-saving device, may be connected to the network or in series or parallel with one or more loads. A voltage to one or more loads may be modified, e.g., by employing voltage tapping or otherwise.

For example, a modification may be introduced as a result of running a simulation of operation of the network. The simulation may identify sources of inefficiency or losses in the network, and may identify modifications that may increase efficiency. Identified losses may include resistance losses, skin effect losses, transformer hysteresis losses, harmonics losses, effects of a negative sequence field on asynchronous motors, or other losses. The simulation may calculate expected results of introduction of various modifications aimed at reducing the losses.

For example, reduction of harmonics in voltage and current may be reduced by using filters that are tuned to the fifth, or fifth and seventh, or other harmonics. Losses due to skin effect in cables, transformers, and loads, by hysteresis in transformers and loads, and negative sequence fields in loads, may be reduced.

Energy saving may be achieved by optimal control of voltage. Supply voltage to loads may vary due to load variation (e.g., due to variations in reactive energy or otherwise), and supply by an electric utility. When production or proper operation of the network (or of a plant or other facility to which the network provides electrical power) is not dependent on the voltage, the voltage may be reduced (e.g., by adjusting tapping) in order to reduce resistive losses. When operation is dependent on voltage, reactive energy may be reduced to stabilize the voltage.

Potential for energy savings may exist under conditions of continuous consumption of electrical energy, rapid load fluctuations which may result in voltage fluctuations, transformer tapping, a load characterized by high levels of harmonics, an existing compensation system that is mechanically switched and not filtered, and long distances between loads and a main switch board.

Measurements on the modified network may be obtained and recorded (block 140). For example, the measurement devices that were operated to perform measurements on the network prior to modification (as discussed in connection with block 110) may be operated to acquire measurements on the modified network.

A unified signature relationship may be calculated for the modified network based on the measurements on the modified network (block 150). For example, the calculation may be similar to the calculation described above (in connection with block 120) for the network prior to modification.

A difference in active power between the calculated unified signature relationships before and after the modification may be evaluated (block 160).

If no further modifications are to be tried report may be generated that indicates any energy savings or increase in efficiency that results from one or more modifications of the electrical network.

If other modifications are to be tried, the further modifications may be made and evaluated (e.g., repeating the operations of blocks 130 through 160). A unified signature based on measurements of the further modified network may be compared to unified signature based on the unmodified network or on a previous modification of the network.

In some cases, further processing of the data may be required in order to quantify an amount of energy savings. For example, a direct comparison may be difficult when the unified signature curves that represent the two sets of measurements do not completely overlap.

For example, the measurements of unified signature curve 42 (FIG. 4) extend over a larger range of load resistance values than do the measurements of compensated unified signature curve 52a. This may be illustrated by a measurement distribution curve.

Figure 7:
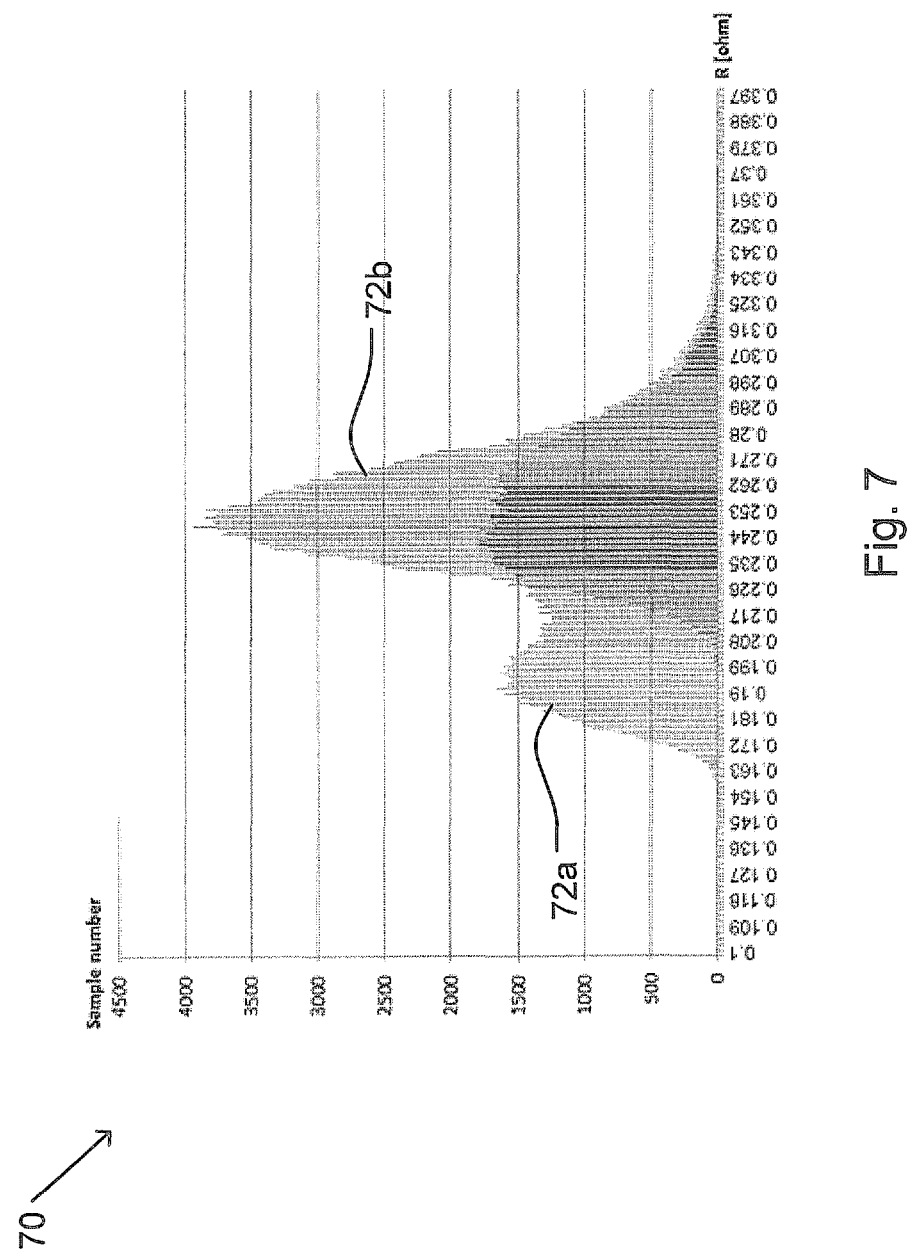
FIG. 7 is a schematic illustration of a graph of a distribution of load resistant measurements used to create unified signature curves of FIG. 4.

FIG. 7 is a schematic illustration of a graph of a distribution of load resistant measurements used to create unified signature curves of FIG. 4.

Graph 70 shows numbers of measurements of each value of load resistance. Load resistance measurement distribution curve 72a corresponds to measurements used to create unified signature curve 42. Load resistance measurement distribution curve 72b corresponds to measurements used to create compensated unified signature curve 52a. The load resistance distributions may differ due to variation in production or other activities or other supply conditions during the two measurement periods. Thus, a simple comparison of between total power in unified signature curve 42 and compensated unified signature curve 52a may not unambiguously demonstrate increased energy savings or efficiency. When load resistance distributions are identical or similar in creating two unified signature curves, a direct comparison may indeed unambiguously indicate differences in energy consumption.

A comparison may include fitting a curve to one or more unified signature relationships. For example, when there is a finite deviation or scatter in the data used to create the signature curves, unambiguous calculation of active power differences may require fitting a curve to the unified signature relationship.

Figure 8:
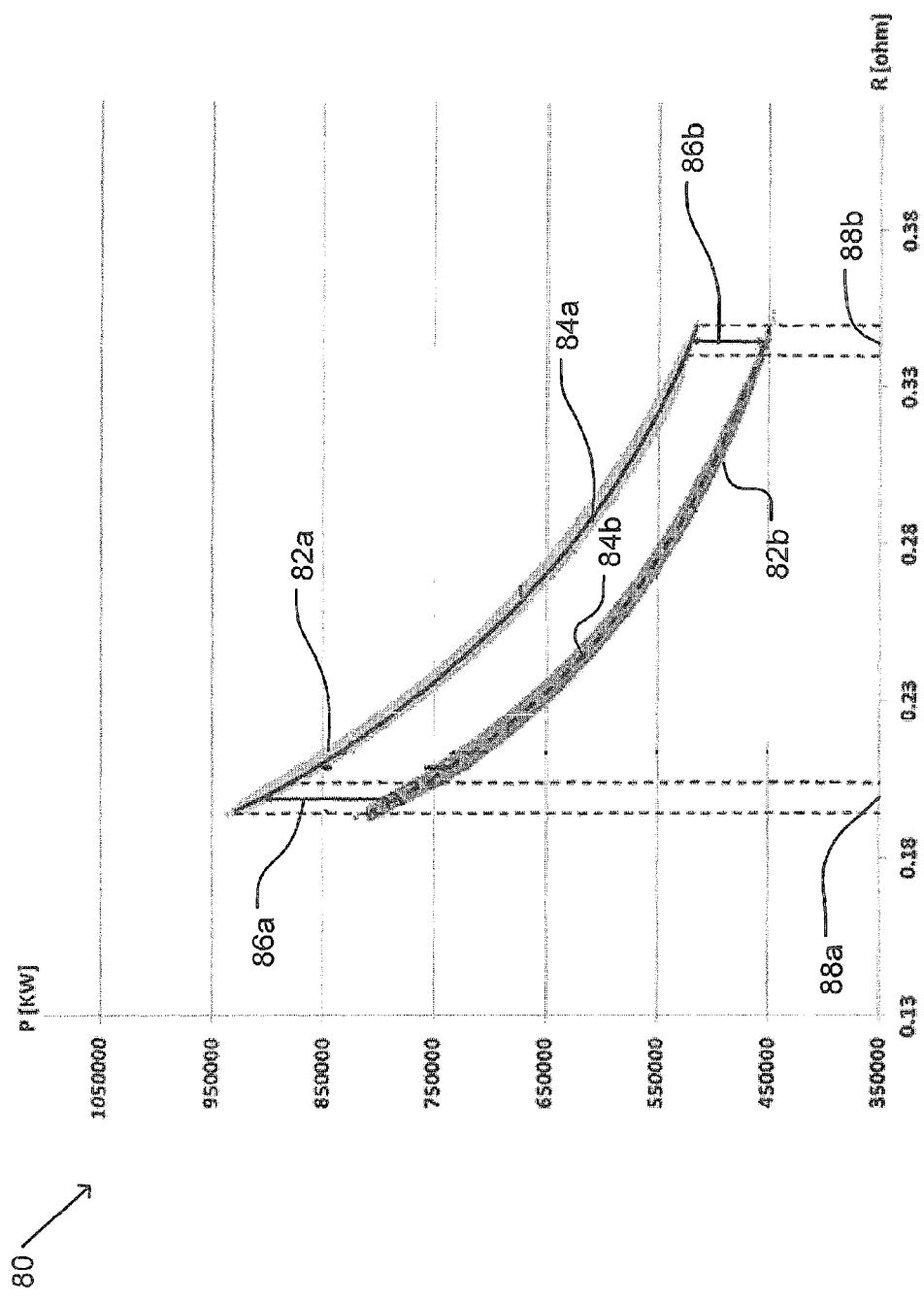
FIG. 8 schematically illustrates fitting a curve to a unified signature.

FIG. 8 schematically illustrates fitting a curve to a unified signature.

Graph 80 shows unified signature curves 82a and 82b. Each of unified signature curves 82a and 82b is fit to a curve 84a and 84b, respectively. As shown, a difference in power consumption, illustrating energy savings of the network of unified signature curve 82b relative to the network of unified signature curve 82a, may vary with load resistance. For example, power difference 86a, representative of resistance range 88a, may be different from power difference 86b, representative of resistance range 88b.

A single representative power difference $\Delta P$ may be calculated for the entire range. The calculation may utilize a distribution of measurements, e.g., as illustrated by FIG. 7.

For example, if the range of load resistance for fitted curves A and B is divided into M equal intervals, each load resistance interval i may be characterized by an active power difference $\Delta P_i$ between the two curves. The value for curve A in interval i may be based on $S_{Ai}$ measurements, and the value for curve B may be based on $S_{Bi}$ measurements. The total number of measurements is $S_{total}$. Then the representative power difference $\Delta P$ may be calculated as $$\Delta P = \sum_{i=1}^{M} \frac{S_{Ai} + S_{Bi}}{S_{total}} \cdot \Delta P_i.$$

Thus, the calculation of ΔP may be described as calculating a weighted average of power differences in different ranges of the equivalent resistance. The each power difference is weighted by the number of measurements that yielded an equivalent resistance value within the corresponding range of equivalent resistance values.

In accordance with an embodiment of the present invention, a simulation may be performed to predict energy savings that would result from modifying an electrical network.

Figure 9:
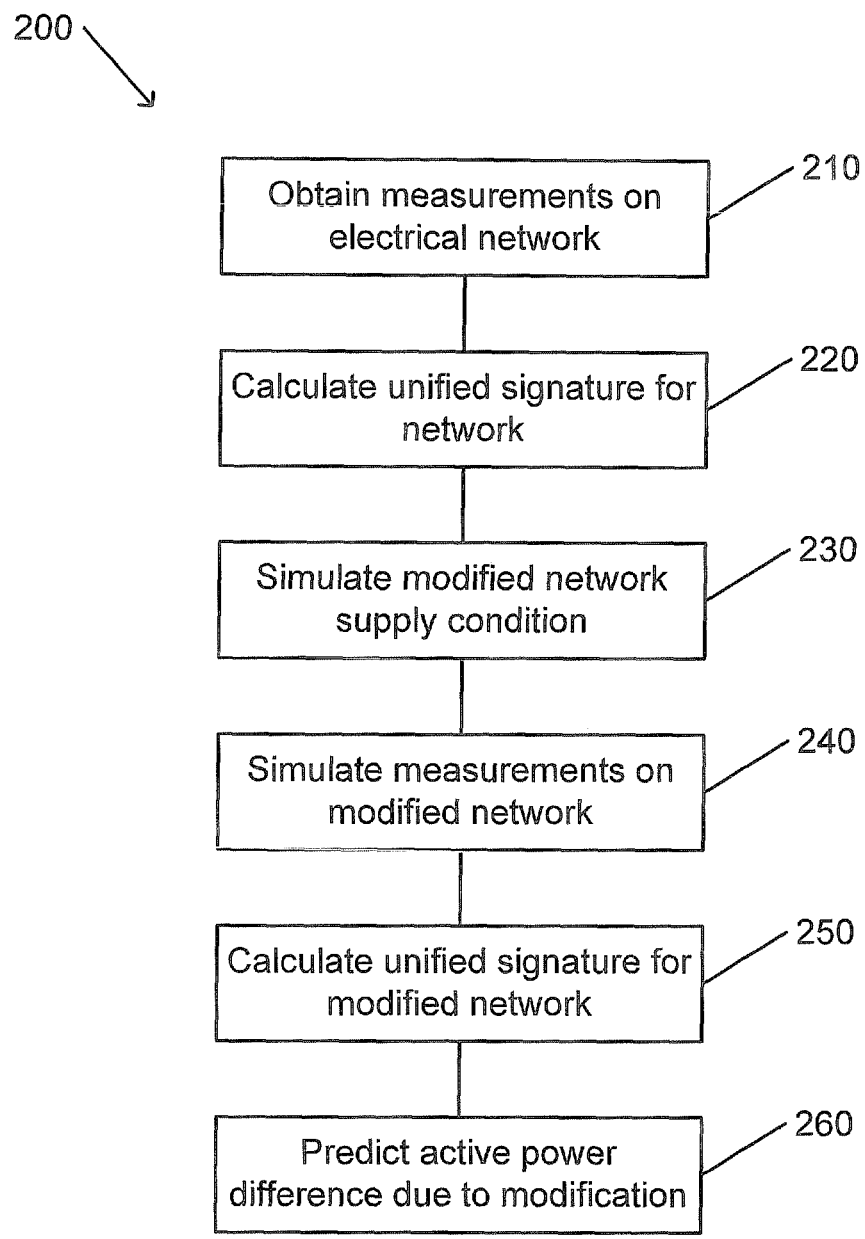
FIG. 9 is a flowchart depicting a method for evaluating energy savings in an electrical network using simulation, in accordance with an embodiment of the present invention.

FIG. 9 is a flowchart depicting a method for predicting energy savings in an electrical network, in accordance with an embodiment of the present invention.

Operations of energy savings prediction method 200 may be executed by a processor. For example, the processor may be a processor that is configured to operate one or more measurement devices that are configured to measure one or more parameters or quantities that are related to operation of an electrical network, and to analyze the measurements.

Measurement devices may be operated to obtain a set of measurements of parameters or quantities that are related to operation of an electrical network (block 210).

A unified signature relationship may be calculated for the network using the obtained measurement results (block 220). For example, the unified signature relationship may relate total active power consumption by the network with a concurrent equivalent resistance based on resistance measurements that were made concurrently with the measurement of the total active power.

A modification of a supply condition of the electrical network may be simulated (block 230). For example, an energy-saving device, such as a compensator or other energy-saving device, may be simulated as connected to the network or in series or parallel with one or more loads. A modification in voltage to one or more loads may be simulated.

Predicted measurements on the modified network may be simulated (block 240). For example, the measurement devices that were operated to perform measurements on the network prior to modification (as discussed in connection with block 210) may be simulated as acquiring measurements (e.g., under similar or identical conditions as the obtained measurements) on the modified network.

A unified signature relationship may be calculated for the modified network based on the simulated measurements (block 250). For example, the calculation may be similar to the calculation described above (in connection with block 220) for the obtained measurements on the network prior to modification.

A predicted difference in active power due to the simulated modification may be calculated (block 260).

If a simulated modification results in predicted energy savings, the simulated modification may be implemented as a modification of the electrical network.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for analysis of energy savings in an electrical network, the method comprising:
    obtaining measurements by a plurality of measurement devices linked to loads of the electrical network over a first period of time;
    calculating a unified signature that characterizes the recorded measurements during the first period of time by combining individual signatures that each relates power consumption by each of the loads to a measured quantity that characterizes that load during the first period of time and that varies during the first period of time;
    obtaining measurements of the plurality of measurement devices in the electrical network over a second period of time after introduction of a modification into the electrical network;
    calculating a unified signature that characterizes the recorded measurements during the second period of time by combining individual signatures that each relates power consumption by each of the loads to a measured quantity that characterizes that load during the second period of time and that varies during the second period of time; and
    comparing the unified signature that characterizes the measurements during the second period of time with the unified signature that characterizes the measurements during the first period of time to calculate energy savings resulting from introduction of the modification.

2. The method of claim 1, wherein the measurements comprise a measurement of active power consumption or of a load resistance.

3. The method of claim 1, wherein the unified signature comprises a relationship between active power consumption by the network and a concurrent equivalent resistance of the network.

4. The method of claim 3, wherein the equivalent resistance is equal to an inverse of a sum of inverses of transformed resistance values of a plurality of loads that are connected to the network, each transformed resistance value including a product of a measured resistance of a load of the plurality of loads and a square of a primary/secondary ratio of a transformer that connects that load to the network.

5. The method of claim 4, wherein the measured resistances of the plurality of loads are measured concurrently.

6. The method of claim 3, wherein comparing the unified signatures comprises calculating a representative power difference between the unified signatures.

7. The method of claim 6, wherein calculating the representative power difference comprises calculating a weighted average of a plurality of power differences in different ranges of the equivalent resistance, each of the plurality of power differences being weighted by a number of measurements that yielded an equivalent resistance value within the corresponding range of the equivalent resistance.

8. The method of claim 1, wherein the introduced modification comprises introduction of a tuned or detuned reactive power compensator.

9. The method of claim 1, wherein the introduced modification comprises adjusting a voltage.

10. The method of claim 1, wherein comparing the unified signatures comprises fitting a curve to at least one of the unified signatures.

11. The method of claim 1, wherein a length of the first period or the second period is selected to correspond to a periodicity in the operation of the electrical network.

12. A method for analysis of energy savings in an electrical network, the method comprising:
obtaining measurements of a plurality of measurement devices linked to loads of the electrical network over a first period of time;
calculating a unified signature that characterizes the recorded measurements during the first period of time by combining individual signatures that each relates power consumption by each of the loads to a measured quantity that characterizes that load during the first period of time and that varies during the first period of time;
simulating predicted measurements of the plurality of measurement devices in the electrical network over a second period of time after introduction of a modification into the electrical network;
calculating a unified signature that characterizes the simulated measurements during the second period of time by combining individual simulated signatures that each relates simulated power consumption by each of the loads to a quantity that characterizes that load during the second period of time and that varies during the second period of time; and
comparing the unified signature that characterizes the measurements during the second period of time with the unified signature that characterizes the measurements during the first period of time to calculate energy savings resulting from introduction of the modification.

\* \* \* \* \*